(12) United States Patent
Negishi et al.

(10) Patent No.: US 7,233,045 B2
(45) Date of Patent: Jun. 19, 2007

(54) SEMICONDUCTOR DEVICE AND SYSTEM (75) Inventors: Takemi Negishi, Honjo (JP); Hiroaki Nambu, Sagamihara (JP); Kazuo Kanetani, Akishima (JP); Hideto Kazama, Ome (JP)

(73) Assignee: Hitachi Ltd, Tokyo (JP)

( * ) Notice: Subject to any disclaimer, the term of this patent is extended or adjusted under 35 U.S.C. 154(b) by 427 days.

(21) Appl. No.: 10/960,985

(22) Filed: Oct. 12, 2004

(65) Prior Publication Data

US 2005/0063112 A1 Mar. 24, 2005

Related U.S. Application Data (63) Continuation of application No. 10/369,683, filed on Feb. 21, 2003, now Pat. No. 6,806,516.

(30) Foreign Application Priority Data

May 30, 2002 (JP) .............................. 2002-156703

(51) Int. Cl.
*H01L 23/62* (2006.01)
(52) U.S. Cl. ...................... 257/355; 257/213; 257/288; 257/E23.002
(58) Field of Classification Search ...................... None
See application file for complete search history.

(56) References Cited

U.S. PATENT DOCUMENTS

| 4,394,590 A | 7/1983 | Honda |
| 5,463,520 A | 10/1995 | Nelson |
| 5,589,790 A * | 12/1996 | Allen ......................... 327/333 |
| 5,610,426 A | 3/1997 | Asai et al. |
| 6,013,932 A | 1/2000 | Chevallier |
| 6,492,686 B1 | 12/2002 | Pappert et al. |

FOREIGN PATENT DOCUMENTS

| JP | 1-248554 | 3/1988 |
| JP | 05-266666 | 3/1992 |
| JP | 06-061831 | 8/1992 |
| JP | 07-086904 | 9/1993 |
| JP | 07-321628 | 5/1995 |
| JP | 2001-251176 | 3/2000 |

* cited by examiner

*Primary Examiner*—Leonardo Andujar
*Assistant Examiner*—Kevin Quinto
(74) *Attorney, Agent, or Firm*—Reed Smith LLP; Stanley P. Fisher, Esq.; Juan Carlos A. Marquez, Esq.

(57) ABSTRACT

Disclosed herewith is a semiconductor device improved to prevent withstand voltage defects that might occur in each MOSFET used therein and a system to be designed easily and prevented from withstand voltage defects that might occur in each semiconductor used therein. The system includes the first and second input circuits, each being constituted by MOSFETs manufactured in the same process. The first input circuit receives a voltage of a first signal inputted from a first external terminal and divided by first and second resistor means while the AC component of the input signal is transmitted to the input circuit through a capacitor disposed in parallel to the first resistor means. The second input circuit receives a second input signal inputted from a second external terminal and reduced in signal amplitude so as to become smaller than that of the first input signal. The system also includes a second semiconductor device corresponding to the first input circuit and a third semiconductor device corresponding to the second input circuit.

7 Claims, 8 Drawing Sheets

▨ WIRING
⊠ CONTACT HOLE

W : WELL
L : ACTIVE AREA
G : GATE ELETRODE

SEMICONDUCTOR DEVICE AND SYSTEM

This application is a Continuation application of U.S. application Ser. No. 10/369,683 filed on Feb. 21, 2003 now U.S. Pat. No. 6,806,516. Priority is claimed based on U.S. application Ser. No. 10/369,683 filed on Feb. 21, 2003, which claims priority to Japanese Patent Application No. 2002-156703 filed on May 30, 2002.

BACKGROUND OF THE INVENTION

The present invention relates to a semiconductor device and a system. More particularly, the present invention relates to a technique usable effectively for an input circuit in each LSI/IC used in a system constituted of a plurality of LSIs/ICs, each having an input/output interface corresponding to a signal voltage different from others.

In an investigation of some well-known examples performed after the completion of the present invention, the present inventor et al have received a report of existence of official gazettes of (1) Japanese Unexamined Patent Publication No. Hei 5(1993)-266666 and (2) Japanese Unexamined Patent Publication No. 2001-251176 that are related to the present invention. The official gazette (1) discloses a semiconductor memory that can prevent transistors from destruction that might occur in the input circuit with use of an input amplitude limiting circuit disposed between an input terminal and the input circuit. The official gazette (2) discloses a level shifting circuit provided with a control circuit 30 for controlling a transfer gate 20. The transfer gate 20 is controlled not so as to receive a voltage over a predetermined withstand voltage of the gate oxide film even when the input voltage exceeds the predetermined withstand voltage.

SUMMARY OF THE INVENTION

In recent years, high-end systems have come to use LSIs/ICs (hereinafter, to be just described as the LSIs) that employ the latest process technique at their core portions on which the system performance depends significantly while they use the LSIs that employ the previous or older process technique at their test/evaluation controlling portions that do not affect the system performance so much. Consequently, the latest LSIs come to be required to support both of the input/output interface related to the core portion and such the input/output interface related to the test/evaluation control portion. Generally, the signal voltage of the latter interface is higher than that of the former interface, so that each of the latest LSIs are also required to have an input circuit for converting a high signal voltage to a low one.

In the case of the official gazette (1), however, the input circuit used for signal voltage conversion as described above has many elements, so that the circuit power consumption increases. The input circuit is thus not considered to be practical so much. On the other hand, in the case of the official gazette (2), the input circuit clamps a signal level with use of a transfer gate MOSFET. For example, the input circuit of which supply voltage is 1.5V clamps an input voltage at 1.5V at the node A even when the input voltage of 1.5V or over is input to the input terminal. Thus, the input voltage never exceeds the 1.5V. When the withstand voltage of the input circuit MOS transistors is 1.8V and the input terminal IN comes to receive a voltage of 1.8V or over, therefore, the input circuit can avoid withstand voltage defects that might occur in the MOS transistors.

In spite of this, when the input voltage is excessively high, the voltage comes to cause a withstand voltage defect in the transfer gate MOSFET itself. This is because the upper limit of the input voltage becomes 3.3V (=1.5V+1.8V) if the supply voltage is 1.5V and the withstand voltage of the transfer gate MOSFET is 1.8V. Concretely, in the conventional example (2), the input voltage has an upper limit and if the input circuit receives a voltage over this upper limit, a withstand voltage defect occurs in a MOS transistor of the input circuit. One of the effective processes for preventing such the withstand voltage defect is to increase the thickness of the gate oxide film of the transfer gate MOSFET so as to increase the withstand voltage of the transistors.

Figure 16:
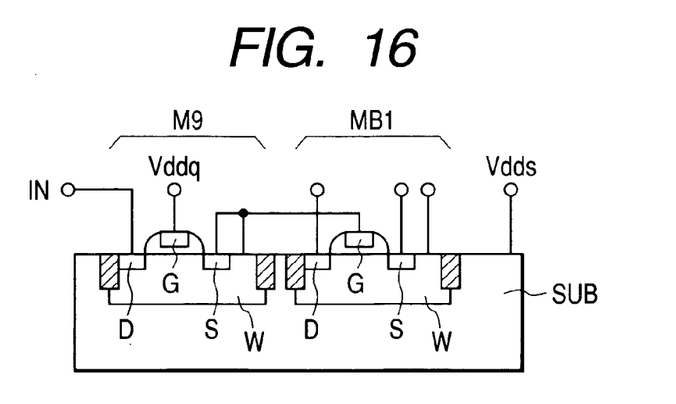
FIG. 16 is a cross sectional view of an elemental structure examined by the present inventor.

FIG. 16 shows a cross sectional view of an element structure examined by the present inventor as described above. In FIG. 16, a MOSFET 9 is used as a transfer MOSFET and an MB1 is shown as a MOSFET constituting the input circuit. In FIG. 16, reference symbols are defined as follows; SUB denotes a semiconductor substrate, W denotes a well, S denotes the source, D denotes the drain, and G denotes the gate of a MOS transistor. For example, the SUB, S, and D are N-type while the W is P-type. Both of the MOSFET9 and the NB1 are shown as N-channel MOS transistors. As shown in FIG. 16, the gate oxide film of the MOSFET9 increases to that of the MOSFETMB1 so as to increase the withstand voltage of the MOSFET9. If the gate oxide film thickness differs between the MOSFET9 and the MB1 in the same semiconductor device, the process will be complicated, thereby the manufacturing cost of the semiconductor device increases.

Under such circumstances, it is an object of the present invention to provide a semiconductor device improved to prevent withstand voltage defects that might occur in MOSFETs without having the process complicated. It is another object of the present invention to provide a system to be developed easily and prevented from withstand voltage defects that might occur in its semiconductor devices. The above and further objects and novel features of the present invention will appear more fully from the detailed description when the same is read in connection with the accompanying drawings.

In order to achieve an object, the semiconductor device of the present invention is constituted as follows. The voltage of each signal inputted from an external terminal is divided by first and second resistance means of the semiconductor device, then transmitted to an input circuit while the AC component of the input signal is transmitted to the input circuit through a capacitor disposed in parallel to the first resistance means. The input circuit forms an internal signal from the divided voltage received from the resistance means so as to reduce the signal amplitude, then transmits the signal to an internal circuit. Each of the input circuit and the internal circuit is constituted by MOSFETs manufactured in the same process.

Furthermore, in order to achieve another object, the system of the present invention comprises a first semiconductor device, a second semiconductor device, and a third semiconductor device. The first semiconductor device includes first and second resistance means used to divide the voltage of a first signal inputted from a first external terminal and transmit the divided voltage to an input circuit and the AC component of the input signal to the input circuit through a capacitor disposed in parallel to the first resistance means. The first semiconductor device also includes a first input circuit that receives the divided voltage and a second input circuit that receives a second input signal from a second external terminal. The second input signal has a smaller amplitude than that of the first input signal. Each of the first and second input circuits is constituted by MOSFETs manufactured in the same process. The second semiconductor device forms an input signal corresponding to the first input circuit, then it is connected to the first semiconductor device. The third semiconductor device forms an input signal corresponding to the second input circuit, then it is connected to the first semiconductor device.

DETAILED DESCRIPTION OF THE PREFERRED EMBODIMENTS

Figure 1:
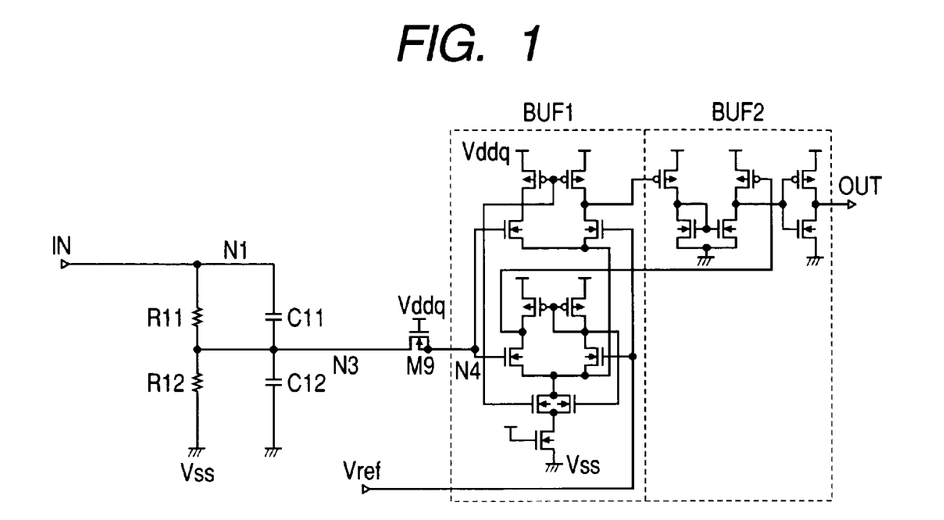
FIG. 1 is a circuit diagram of an input circuit in an embodiment of the present invention.

FIG. 1 shows a circuit diagram of an input circuit used in a semiconductor device in an embodiment of the present invention. Resistors R11 and R12 are connected to each other serially so as to constitute a voltage dividing circuit disposed between an input terminal IN and the ground potential of the input circuit. The resistance values of the resistors R11 and R12 are controlled so that a current flowing from the input terminal IN satisfies a predetermined standard. If a voltage dividing circuit is constituted so as to obtain such a large resistance value, transmission of input signals will be delayed due to, for example, the parasitic resistance, etc. added to the voltage dividing output node while the power consumption of the semiconductor device is reduced.

In this embodiment, therefore, to realize both reduction of the power consumption and quick operation of the semiconductor device, a capacitor C11 is connected to the resistor R11 in parallel. In other words, the AC component of each input signal is transmitted through the capacitor C11, thereby a divided voltage is output quickly to cope with the changes of input signals. The capacitor C12 has a capacitance parasitic to the node N3 at such the divided voltage output.

The voltage of a signal output from the internal node N3 is divided by the resistors R11 and R12. Although not restricted specially, the signal is then transmitted to the input circuit constituted by input buffers BUF1 and BUF2 through a clamping MOSFET9. The output signal OUT of the input circuit (BUF1 and BUF2) is transmitted to an internal circuit (not shown). The input buffers BUF1 and BUF2 are current mirror CMOS amplifiers combined into a two-step (input and output) input circuit.

The input step buffer BUF1, which is a current mirror CMOS amplifier, includes two pairs of single-end configuration differential amplification circuits used to receive a signal from the input terminal N4 and a reference voltage VREF. The buffer BUF1 forms differential amplification signals of which phases are positive and negative with respect to the signals inputted from each of the differential amplification circuits. The output step buffer BUF2, which is another current mirror CMOS amplifier, receives both positive phase and negative phase differential signals at a p-channel MOSFET and transmits those signals to a current mirror circuit constituted by N-channel MOSFETs to drive a CMOS inverter circuit for constituting an output circuit that outputs a differential current.

The MOSFETM9 disposed in the input block of the input step buffer BUF1 is used to clamp a voltage. For example, while the supply voltage Vddq is 1.5V, the potential of the input terminal node N4 of the input step buffer BUF1 is clamped at 1.5V-Vt (Vt: the threshold voltage of the MOSFETM9) even if the input voltage to the node N4 becomes 1.5V or over.

The voltage-dividing resistors R11 and R12 provided in the input circuit as described above can thus reduce the voltage of the node N3 output from the resistors R11 and R12 to VIN·r12/(r11+r12) with respect to the input voltage VIN inputted from the input terminal IN. Both r11 and r12 denote resistance values of the resistors R11 and R12. If the ratio between R11 and R12 is decided properly, therefore, the MOSFETM9 is prevented from withstand voltage defects.

For example, when the supply voltage Vddq is 1.5V, the clamping MOSFETM9 withstand voltage is 1.8V, and the maximum input voltage VIN is 3.6V, the ratio may be set, for example, at r11/r12=1. At this time, the voltage V3 of the node N3 is calculated as follows.

$$V3 = VIN \times r12/(r11+r12) = 3.6 \times \tfrac{1}{2} = 1.8V.$$

Thus, no withstand defect occurs in the MOSFETM9 located in the input circuit. Here, V3 denotes the voltage of the node N3 and VIN denotes the input voltage of the input terminal IN.

Generally, an input current to an input circuit of a semiconductor device is required to be reduced enough to satisfy a desired standard. Consequently, both r11 and r12 values of the resistors R11 and R12 in a voltage dividing circuit are required to have large resistance values to a certain extent. And, when the r11 and r12 values increase, the time constant $c12 \times (r11 \times r12)/(r11+r12)$ of the node N3 also increases. The c12 denotes the value of the parasitic capacitance C12.

When the time constant increases, a problem occurs; the voltage of the node N3 comes to be disabled to follow the voltage changes of the input signals inputted from the input terminal IN quickly as required.

In this embodiment, the capacitor C11 is disposed in parallel to the resistor R11 to solve such the problem. This capacitor C11 has a so-called speedup capacitance. If the capacitance is defined as c11, the C11 is set so that c11≧c12×r11/r12 is satisfied. When the c11 is set such way, the voltage of the node N3 is speeded up enough to response to the voltage changes of the signals inputted from the input terminal IN. In the input circuit of the present invention, therefore, there is no need to form the gate insulator of the MOSFETM9 thicker than that of the MOSFETs of the BUF1 and BUF2 of the input circuit to improve the withstand voltage. In other words, it is possible to manufacture the MOSFETM9 and the MOSFETs for constituting both BUF1 and BUF2 in the same process so that withstand voltage defects that might occur in the MOSFETs is prevented while the power consumption of the device is reduced.

Figure 2:
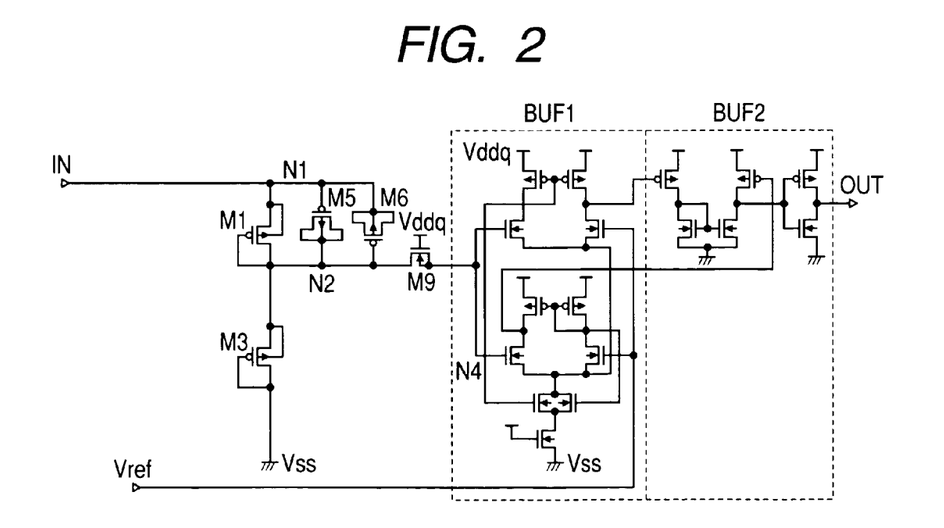
FIG. 2 is a circuit diagram of an input circuit in another embodiment of the present invention.

FIG. 2 shows a circuit diagram of an input circuit in another embodiment of the present invention. In this embodiment, the resistors R11 and R12, as well as the capacitor C11 shown in FIG. 1 are constituted by MOSFETs respectively. Concretely, the resistor R11 is constituted by a MOSFETM1 having a source connected to the input terminal IN and a gate and a drain corresponding to the node N2 corresponding to a divided voltage output respectively. The resistor R12 is constituted by a MOSFETM3 having a source connected to the node N2 and a gate and drain connected to the ground potential point VSS of the input circuit. The capacitor C11 is constituted by a MOSFETM5 and a MOSFETM6 that are connected to each other in parallel. The MOSFETM5 has a gate connected to the source (node N1) of the MOSFETM1. The MOSFET5 also has a source, a drain, and a well connected commonly to the drain (node N2) of the MOSFETM1. The MOSFETM6 has a gate connected to the drain (node N2) of the MOSFET1. The MOSFETM6 also has a source, a drain, and a well connected commonly to the source (node N1) of the MOSFETM1.

The capacitor C11 uses the gate capacitance of the MOSFETM5 and M6 respectively. The MOSFETM5 and M6 are connected to each other in parallel as described above so as to compensate the characteristics that the capacitance comes to differ between positive voltage application time and negative voltage application time. Other parts in the input circuit are similar to those in the circuit shown in FIG. 1. When MOSFETs are used as both resistor means and capacitor means just like in this embodiment, the element-mounted area on the semiconductor substrate can be reduced. The resistors R11 and R12 are formed so as to have a large resistance value respectively. For example, if both R11 and R12 are formed with a polysilicon layer respectively, each of them will occupy a larger area to obtain a larger resistance value. On the other hand, each of the MOSFETM1 and the MOSFET2, when they are similar in gate width to the MOSFETM9 while they are longer in gate length than the MOSFETM9, can realize a large resistance respectively at a small area.

In the MOSFETM1 and M3 of the resistors R11 and R12, the wells are separated electrically from each other and connected to the sources so that each signal inputted from the input terminal IN and reduced in amplitude is transmitted to the input terminal (node N4) of the input circuit (constituted by BUF1 and BUF2). The capacitor C11 is constituted by MOSFETM5 and M6, each of which uses one end as a gate terminal and the other end as a terminal to which the source, the drain, and the well are connected commonly. And, the wells of the MOSFETM5 and M6 are separated electrically from the wells of MOSFETs of other internal circuits so that they are connected to the sources of the MOSFETM5 and M6 respectively.

The input circuit, since it is constituted as described above, can reduce the voltage of the node N2 to the voltage r1/(r1+r3) inputted from the input terminal IN. Here, r1 and r3 denote equivalent resistance values of the MOSFETM1 and M3. If the ratio between r1 and r3 is designed properly, therefore, withstand voltage defect occurrence can be prevented. For example, when the supply voltage Vddq is 1.5V, the withstand voltage of the MOSFETM9 is 1.8V, and the maximum input voltage is 3.6V, it is just required to satisfy r1/r3=1. At this time, the voltage V2 of the node N2 is calculated as follows.

$$V2 = VIN \times r3/(r1+r3) = 3.6 \times \tfrac{1}{2} = 1.8V$$

Thus, no withstand voltage defect occurs in the voltage clamping MOSFETM9 of the input circuit. The V2 denotes the voltage of the node N2 and the VIN denotes the input voltage of the input terminal IN.

In this embodiment, in the MOSFETM1 and M3, the wells are separated electrically from each other and connected to the sources respectively. Thus, no withstand voltage defect occurs in the MOSFETM1 and M3. If the wells of the MOSFETM1 and M3 are not separated electrically from each other just like in ordinary cases so that they are fixed at the highest (for P-channel MOS transistors) or lowest potential (for N-channel MOS transistors), a withstand voltage defect will occur between the gate and the well. For example, if the wells of the P-channel MOSFETM1 and M3 are fixed at 3.6V as usually, the voltage between the gate and the well becomes 3.6V at VIN=0V, causing a withstand voltage defect to occur. On the other hand, if the wells are connected to the sources in the MOSFETM1 and M3 just like in this embodiment, the voltage between the gate and the well does not exceed 1.8V, thereby no withstand voltage defect will occur.

Each of the MOSFETM5 and M6 functions as a speedup capacitance so that the voltage of the node N2 can follow the voltage changes of the input terminal IN quickly as required. And, in the MOSFETM5 and M6, the wells are separated electrically from each other and connected to the sources respectively, so that no withstand voltage defect occurs in the MOSFETM5 and M6. In addition, the gate of the MOSFETM5 is connected to the higher potential terminal while the gate of the MOSFETM6 is connected to the lower potential terminal. The characteristics thus become the same between the higher potential terminal and the lower potential terminal. And, as described above, the input circuit of the present invention has the following effects. MOSFETs are prevented from withstand voltage defects. In addition, each of the MOSFETs does not increase its layout area even at a resistance value of the input circuit set larger to reduce the input current of the input circuit.

Figure 3:
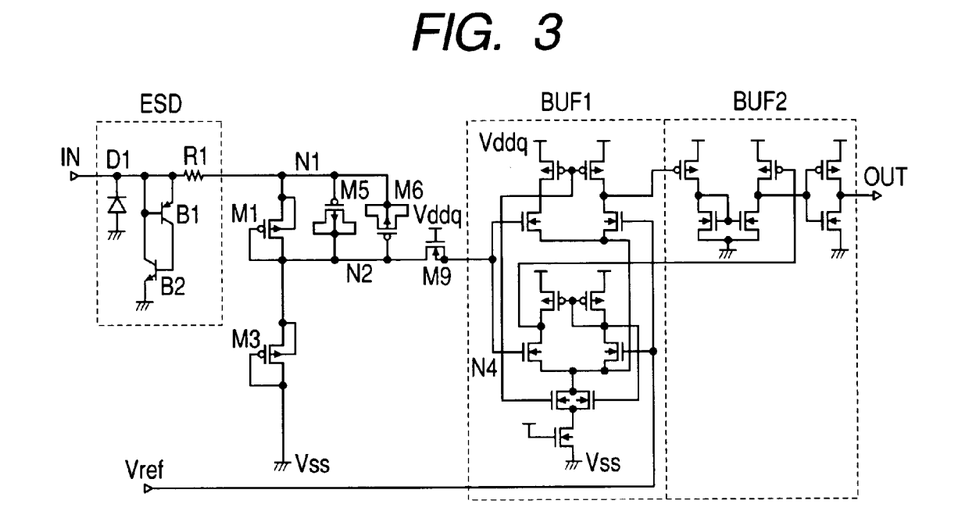
FIG. 3 is a circuit diagram of an input circuit in still another embodiment of the present invention.

FIG. 3 shows a circuit diagram of an input circuit in still another embodiment of the present invention. In this embodiment, an electrostatic destruction preventive circuit ESD is formed at the input terminal IN. The circuit ESD is used to prevent electrostatic destruction that might occur each MOSFET in the input circuit. Other parts in the input circuit are similar to those in the embodiment shown in FIG. 2. The circuit ESD is constituted by thyristors B1 and B2 that become conductive when the potential of the input terminal IN exceeds a predetermined level, a diode D1 that becomes conductive when the potential of the input terminal IN goes lower than a predetermined level, and a resistor R1.

The resistor R1, when MOSFETM5 and M6 of the capacitor C11 are added thereto, is combined with a capacitance (not shown) parasitic to the node N1 to constitute a low-pass filter so as to block the high frequency component of the surge voltage from the LSIs. In this embodiment, the MOSFETM5 and M6 that constitute the speedup capacitance C11 can be shared by the low-pass filter capacitance, so that the chip size is reduced.

Figure 4:
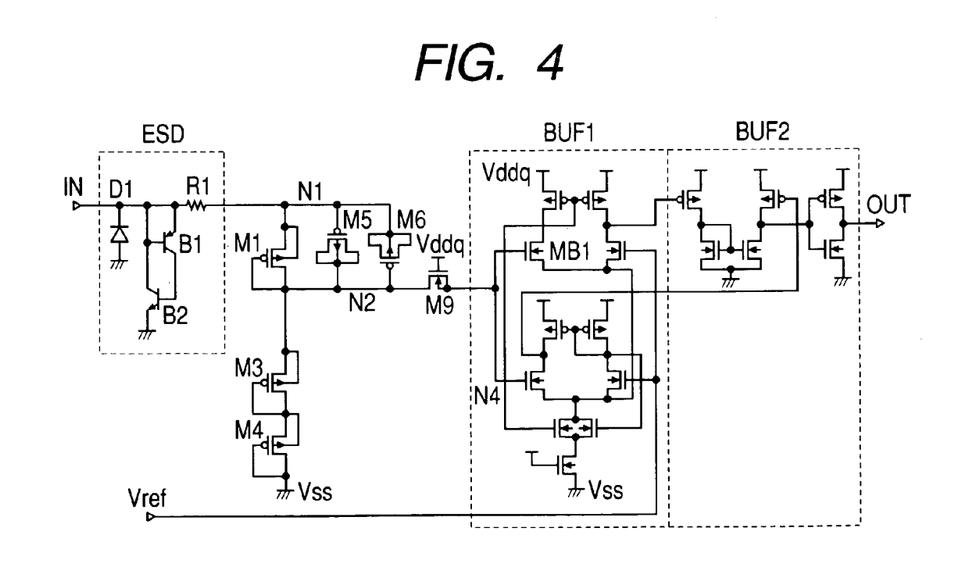
FIG. 4 is a circuit diagram of an input circuit in still another embodiment of the present invention.

FIG. 4 shows a circuit diagram of an input circuit in still another embodiment of the present invention. This embodiment is a variation of the embodiment shown in FIG. 3. Addition of MOSFETM4 to be included in a dividing circuit in this embodiment is only a difference from the embodiment shown in FIG. 3. The MOSFETM4 is placed between the drain of the MOSFETM3 shown in FIG. 3 and the ground potential point Vss of the input circuit. In the MOSFETM4, the source and the well are connected to each other while the gate and the drain are connected to each other. Because the MOSFETM4 is disposed such way, the input circuit can cope with a further increase of the potential of the input terminal IN.

For example, when the supply voltage Vddq is 1.5V, the withstand voltage of the MOSFETM9 is 1.8V, and the maximum input voltage IN is 4.8V, it is just required to satisfy a ratio of r1:r3:r4=1:1:1. Here, r1, r3, and r4 denote equivalent resistance values of the MOSFETM1, M3, and M4. V2 denotes the voltage of the node N2 and VIN denotes the voltage of the input terminal IN. If it is taken into consideration that the resistance value of the resistor R1 is smaller enough than any of r1, r3, and r4, the voltage V2 of the node N2 is calculated as follows.

$$V2 = VIN \times (r3+r4)/(r1+r3+r4) = 4.8 \times 2/3 = 3.2V$$

The voltage dividing as described above will thus never cause any withstand voltage defect to occur in the MOSFETM9 of the input circuit. And, because the wells are separated electrically from each other and connected to the sources in the MOSFETM1, M3, and M4 respectively, the voltages to be applied to the MOSFETM1, M3, and M4 never exceed 1.6V, so that no withstand voltage defect occurs in any of the MOSFETM1, M3, and M4.

Figure 5:
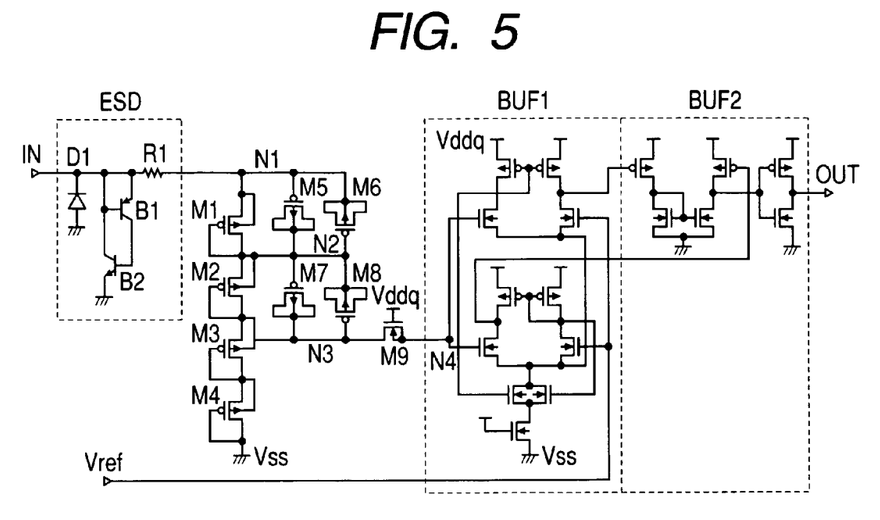
FIG. 5 is a circuit diagram of an input circuit in still another embodiment of the present invention.

FIG. 5 shows a circuit diagram of an input circuit in still another embodiment of the present invention. This embodiment is a variation of that shown in FIG. 4. Differences of this embodiment from that shown in FIG. 4 are only that the MOSFETM2 is disposed between the drain of the MOSFETM1 and the first node N2, and MOSFETM7 and M8 are connected serially to the MOSFETM5 and M6, each constituting a capacitor. In the MOSFETM2, the source and the well are connected to each other while the gate and the drain are connected to each other. In other words, two capacitors (MOSFETM7 and M8) are disposed at both ends of the MOSFETM2 and connected to each other in parallel. In this embodiment, it is expected that the potential level of the signal inputted to the input terminal IN is higher (positive voltage) than the ground potential Vss of the input circuit, the MOSFETM1 and M2 are P-channel MOSFETs, and the MOSFETM5 to M8 are P-channel MOSFETs.

When the MOSFETM2 is disposed as described above, the input circuit comes to cope with a higher potential of the input voltage VIN of the input terminal IN. For example, when the supply voltage Vddq is 1.5V, the withstand voltage of the MOSFETM9 is 1.8V, and the maximum input voltage VIN is 6.4V, it is just required to satisfy a ratio of r1:r2:r3:r4=1:1:1:1. Here, r1 to r4 denote the equivalent resistance values of the MOSFETM1 to M4. V3 denotes the voltage of the node N3 and VIN denotes the voltage of the input terminal IN. At this time, when it is taken into consideration that the resistance value of the resistor R1 is smaller enough than any of r1 to r4, the voltage V3 of the node N3 is calculated as follows.

$$V3 = VIN \times (r3+r4)/(r1+r2+r3+r4) = 6.4 \times 2/4 = 3.2V$$

In the above input circuit, no withstand voltage defect occurs in the MOSFETM9. In addition, in the MOSFETM1 to M4, the wells are separated electrically from each other and connected to the sources respectively, so that the voltage to be applied to the MOSFETM1 to M4 never exceeds 1.6V, thereby preventing the MOSFETM1 to M4 from withstand voltage defects that might occur therein. In addition, in the MOSFETM5 to M8, the wells are separated electrically from those and connected to the sources in other MOSFETs, the voltage to be applied to the MOSFETM5 to M8 thus never exceeds 1.6V, thereby preventing the MOSFETM5 to M8 from withstand voltage defects that might occur therein.

Because it is expected that the potential level of the signal inputted to the input terminal IN is higher (positive voltage) than the potential level of the ground potential Vss of the above input circuit while the MOSFET1 is a P-channel MOSFET, it can be prevented that each PN junction formed with a well and a substrate or deep well is biased sequentially. For example, in this embodiment, the MOSFETM1 is constituted by an N-type MOSFET, the P-well in which such the MOSFETM1 is formed comes into contact with an N-type substrate or deep well connected to the supply power Vdds (ex., 2.5V) of which potential is usually highest.

As described above, in the MOSFETM1, the well is connected to the source, so that the well of the MOSFETM1 becomes 2.7V(=3.6V×3/4) when the input voltage VIN of the input circuit is 3.6V. Consequently, each PN junction formed by a well and a substrate or deep well is biased to 0.2V sequentially. As a result, the electrical isolation is destructed and an extremely large current flows in the substrate, thereby a latch-up event might occur. On the other hand, if the MOSFETM1 is constituted by a P-channel MOSFET, the N-well of this MOSFET comes into contact with a P-type substrate or deep well connected to the lowest potential supply voltage Vss=0V. On the contrary, the well is connected to the source in the MOSFETM1, the well voltage of the MOSFETM1 changes between 0 to 3.6V, so that each PN junction formed by a well and the substrate or deep well is never biased sequentially.

Similarly, because it is expected that the potential level of the signal inputted to the input terminal IN is higher than the potential level of the ground potential Vss of the above input circuit while the MOSFETM5 and M6 are P-channel MOSFETs, it is prevented that each PN junction formed with a well and a substrate or deep well is biased sequentially.

Figure 6:
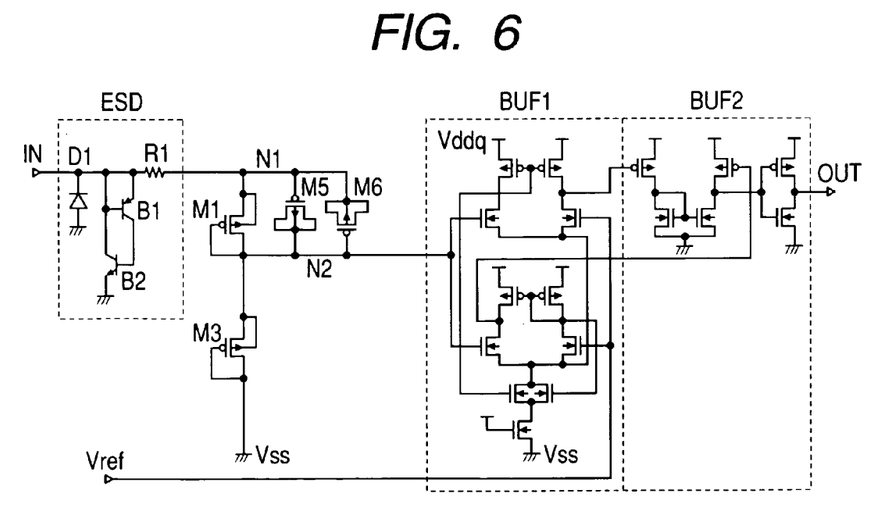
FIG. 6 is a circuit diagram of an input circuit in still another embodiment of the present invention.

FIG. 6 shows a circuit diagram of an input circuit in still another embodiment of the present invention. This embodiment is a variation of that shown in FIG. 3. The omission of the clamping MOSFETM9 is only a difference of this embodiment from that shown in FIG. 3. For example, when the supply voltage Vddq is 1.5V, the withstand voltage of the MOSFET included in the input step BUF1 is 1.8V, and the maximum input voltage VIN is 3.6V, it is just required to satisfy r1/r3=1. Here, r1 and r3 denote the equivalent resistance values of the MOSFETM1 and M3. V2 denotes the voltage of the node N2 and VIN denotes the voltage of the input terminal IN. At this time, the voltage V2 of the node N2 is calculated as follows.

$$V2=VIN \times r3/(r1+r3)=3.6 \times \tfrac{1}{2}=1.8V$$

Thus, no withstand voltage defect occurs in the MOSFET of the input step BUF1. In addition, the signal voltage response is speeded up due to the omission of the voltage clamping MOSFETM9.

Figure 7:
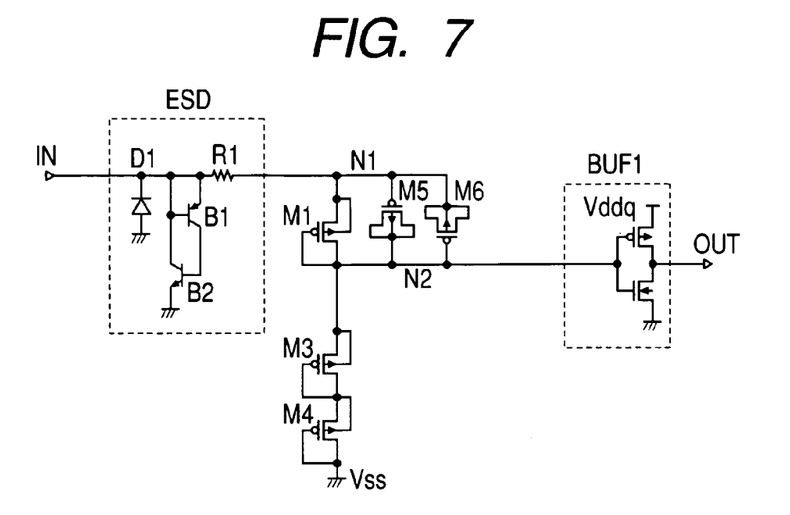
FIG. 7 is a circuit diagram of an input circuit in still another embodiment of the present invention.

FIG. 7 shows a circuit diagram of an input circuit in still another embodiment of the present invention. This embodiment is a variation of that shown in FIG. 4. The replacement of the clamping MOSFETM9 and the two-step input buffer (BUF1 and BUF2) with inverters are only differences of this embodiment from that shown in FIG. 4. As described above, in the embodiment shown in FIG. 4, when the supply voltage Vddq is 1.5V and a voltage of 1.5V or over is inputted to the node N2, the potential of the node N4 is clamped at 1.5V-Vt; it never exceeds the value.

In other words, when the supply voltage Vddq is decided, both of the high potential of the node N4 and the low potential are also decided as Vddq-Vt and as 0V uniquely. Consequently, the logical threshold of the BUF1 must be set corresponding to the potential of the supply voltage Vddq just like (Vddq-Vt)/2=(1.5−0.5)/2=0.5V(at Vt=0.5V). This is why the BUF1 needs a reference voltage Vref used to decide the logical threshold.

If the MOSFETM9 is omitted as described above, the ratio among r1, r3, and r4 can be set for the potential of the node N2. Here, r1, r3, and r4 denote equivalent resistance values of the MOSFETM1, M3, and M4. The r1, r3, and r4 can be used to set the logical threshold value of the BUF1 constituted by an inverter circuit. For example, if the supply voltage Vddq is 1.5V and the maximum input voltage VIN is 3.3V at a ratio of r1:r3:r4=1.8:0.75:0.75 while it is taken into consideration that the resistance value of the resistor R1 is smaller enough than any of r1, r3, and r4, the voltage V2 of the node N2 is calculated as follows.

$$V2=VIN \times (r3+r4)/(r1+r3+r4)=3.3 \times \tfrac{1.5}{3.3}=1.5V$$

Thus, it comes to be possible to use an inverter that can satisfy a threshold value Vddq/2=0.75V as the BUF1.

Figure 8:
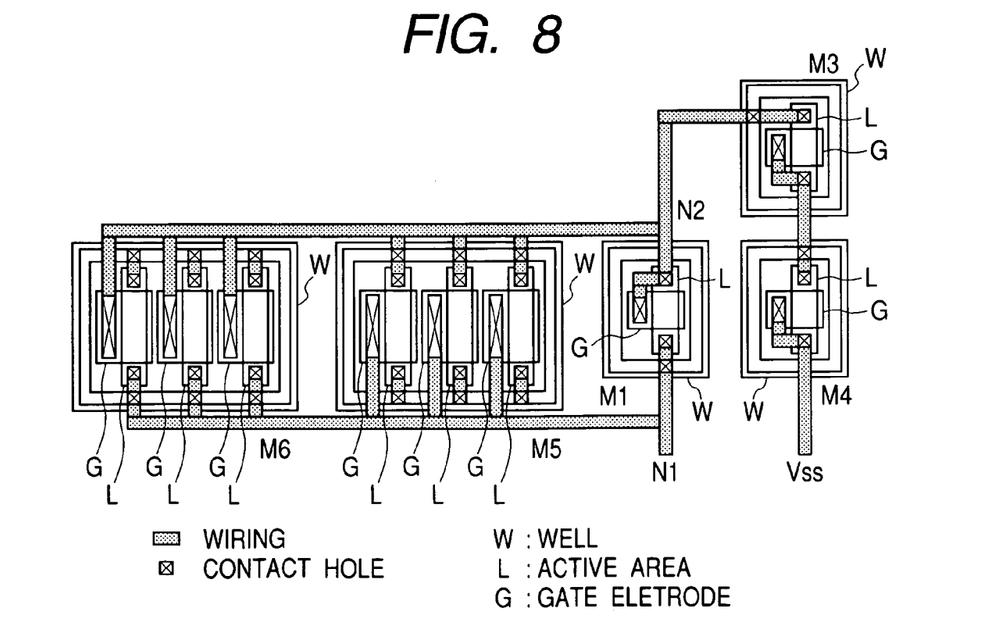
FIG. 8 is a layout of the MOSFETs for constituting an input circuit in an embodiment of the present invention.

FIG. 8 shows an embodiment for a layout of a MOSFET included in the input circuit of the present invention. The layout shown in FIG. 8 includes the MOSFETM1 and M3 to M6 shown in FIG. 4. The reference symbols in FIG. 8 are defined as follows; W denotes a well, L denotes an active area, and G denotes a gate. In this embodiment, the wells are separated electrically from each other and connected to the sources in the MOSFET1 and M3 to M6. Consequently, no withstand voltage defect occurs in any of the MOSFETM1 and M3 to M6.

Figure 9:
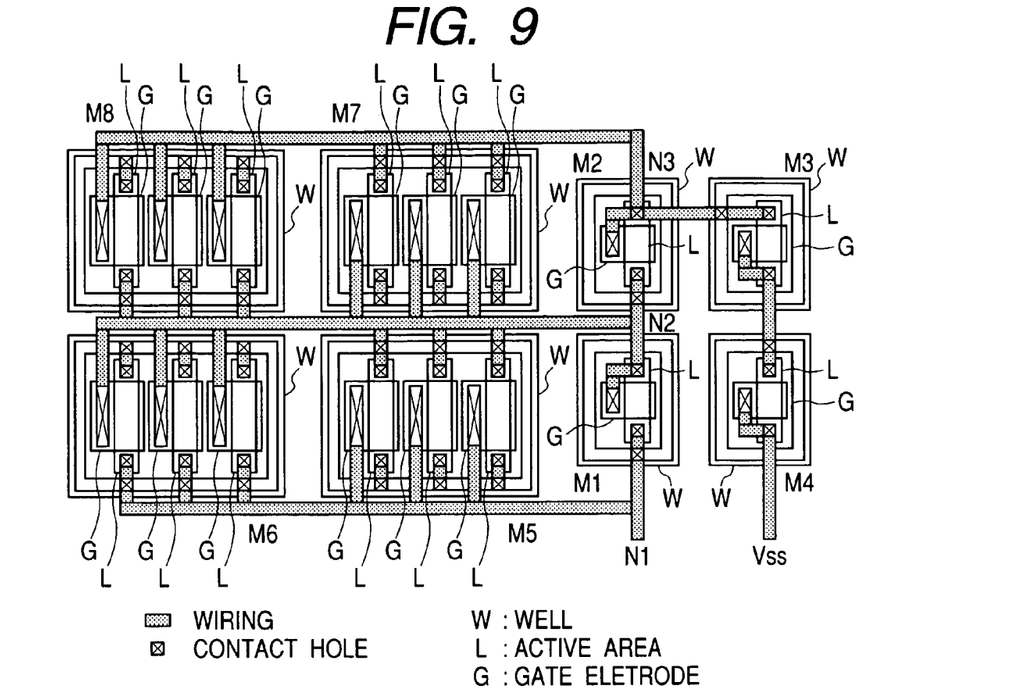
FIG. 9 is a layout of the MOSFETs for constituting an input circuit in another embodiment of the present invention.

FIG. 9 shows another embodiment for the layout of the MOSFETs included in the input circuit of the present invention. The layout shown in FIG. 9 includes the MOSFETM1 to MB shown in FIG. 5. In FIG. 9, the reference symbols are defined as follows; W denotes a well, L denotes an active area, and G denotes a gate. Also in the MOSFETM1 to M8, the wells are separated electrically from each other and connected to the sources. Consequently, the input voltage VIN is shared by those MOSFETM1 to M8, so that no withstand voltage defect occurs in any of those MOSFETM1 to M8.

Figure 10:
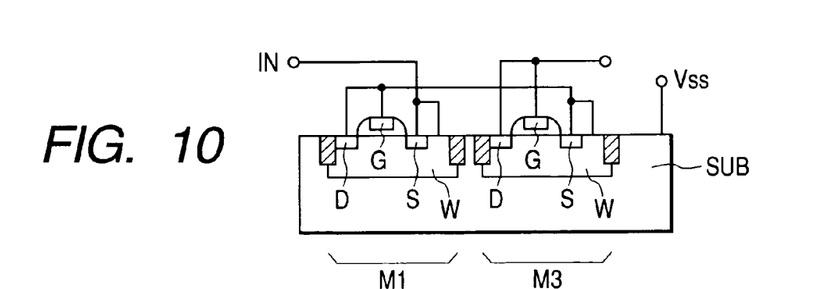
FIG. 10 is a cross sectional view of an elemental structure of the MOSFETs for constituting an input circuit in an embodiment of the present invention.

FIG. 10 shows a cross sectional view of an elemental structure in an embodiment of the MOSFETM1 and M3 located in the input circuit of the present invention. The reference symbols shown in FIG. 10 are defined as follows; SUB denotes a semiconductor substrate, W denotes a well, S denotes a MOSFET source, D denotes a drain, and G denotes a gate. In this embodiment, the SUB, the S, and the D are P-type, the W is N-type, and the MOSFETM1 and M3 are P-channel MOSFETs.

The wells are separated electrically from each other and connected to the sources respectively in the MOSFETM1 and M3. Consequently, no withstand voltage defect occurs in any of the MOSFETM1 and M3. And, as described above, it is expected that the potential level of the signal inputted to the input terminal IN is higher (positive voltage) than the potential level of the ground potential Vss of the input circuit, so that a P-channel MOSFET is used as the MOSFETM1. Thus, it is prevented that each PN junction formed by a well W and a substrate SUB is biased sequentially.

Figure 11:
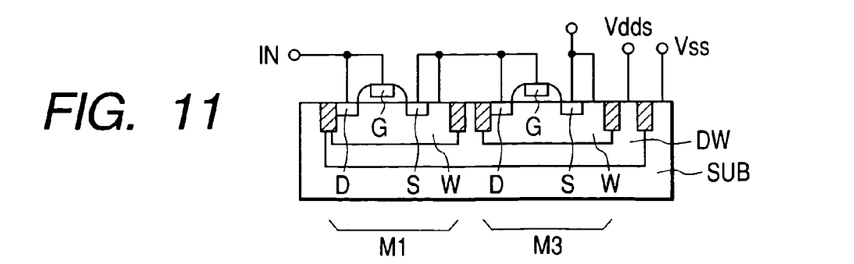
FIG. 11 is a cross sectional view of an elemental structure of the MOSFETs for constituting an input circuit in another embodiment of the present invention.

FIG. 11 shows a cross sectional view of an elemental structure of a MOSFET included in the input circuit in another embodiment of the present invention. In this embodiment, the MOSFETM1 and M3 used in the input circuit shown in FIG. 2 or the like are replaced with N-channel MOSFETs. The reference symbols shown in FIG. 11 are defined as follows; SUB denotes a semiconductor substrate, DW denotes a deep well, W denotes a well, S denotes a MOSFET source, D denotes a drain, and G denotes a gate. The MOSFET shown in FIG. 11 has a 3-layer well structure. In this embodiment, the DW, the S, and the D are N-type and the SUB and the W are P-type while the MOSFETM1 and M3 are P-channel MOSFETs. Also in this embodiment, the wells W are separated electrically from each other and connected to the sources S respectively in the MOSFETs. Consequently, no withstand voltage defect occurs in any of the MOSFETs.

Figure 12:
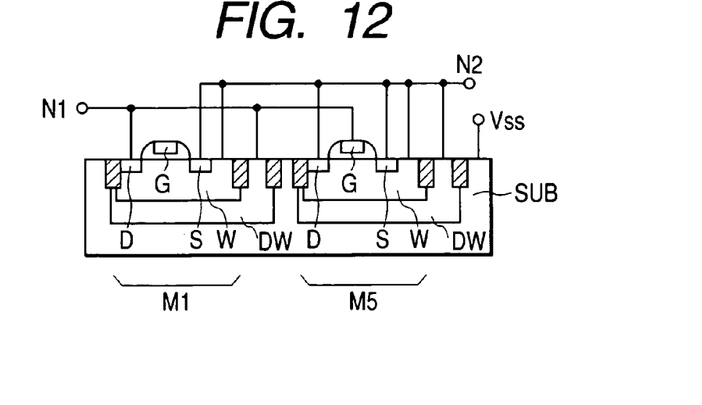
FIG. 12 is a cross sectional view of an elemental structure of the MOSFETs for constituting an input circuit in still another embodiment of the present invention.

FIG. 12 shows a cross sectional view of an elemental structure in still another embodiment of the MOSFETs located in the input circuit of the present invention. In this embodiment, the MOSFETM1 and M5 shown, for example, in FIG. 5 are replaced with N-channel MOSFETs. The reference symbols shown in FIG. 12 are defined as follows; SUB denotes a semiconductor substrate, DW denotes a deep well, W denotes a well, S denotes a MOSFET source, D denotes a drain, and G denotes a gate. The MOSFET shown in FIG. 12 has a 3-layer well structure.

In this embodiment, the DW, the S, and the D are N-type and the SUB and the W are P-type while the MOSFETM1 and M5 are N-channel MOSFETs. Also in this embodiment, the wells W are separated electrically from each other and connected to the sources S respectively in the MOSFETs. In addition, the deep wells are separated from each other electrically and connected to the drains in the MOSFETs. Consequently, no withstand voltage defect occurs in any of the MOSFETM1 and M5. In addition, it is prevented that each PN junction formed by a well W and a deep well DW is biased sequentially.

Figure 13:
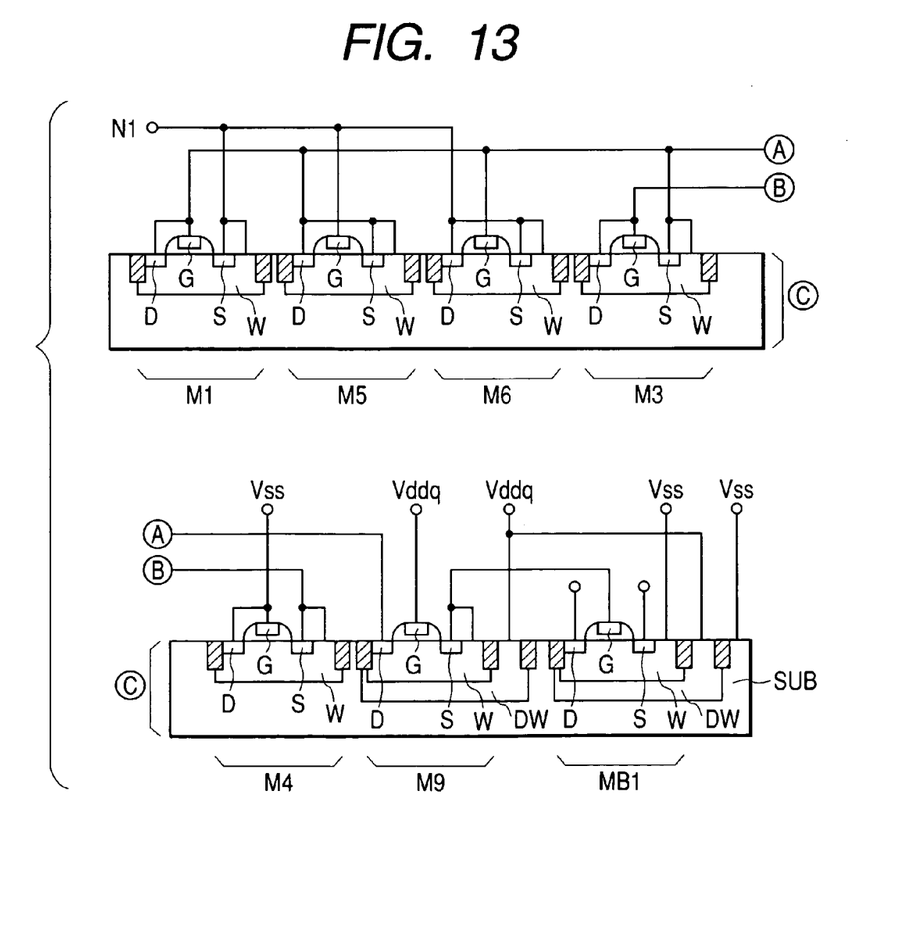
FIG. 13 is a cross sectional view of an elemental structure of the MOSFETs for constituting an input circuit in still another embodiment of the present invention.

FIG. 13 shows a cross sectional view of an elemental structure in still another embodiment of the MOSFETs located in the input circuit of the present invention. In this embodiment, while the MOSFETM1, M5, M6, and M3, as well as MOSFETM4, M9, and MB1 are disposed separately in the upper and lower portions, they are all connected to each other through the portions denoted by A to C. In this embodiment, the structures of the MOSFETM1, M3 to M6, M9, and MB1 are shown in FIG. 13. The reference symbols shown in FIG. 13 are defined as follows; SUB denotes a semiconductor substrate, DW denotes a deep well, W denotes a well, S denotes a MOSFET source, D denotes a drain, and G denotes a gate. In this embodiment, the SUB is P-type and the DW is N-type, the W's of the DW, MOSFETM1, M3 to M6 are N-type while the S and the D are P-type, the W's of the MOSFETM9 and MB1 are P-type while the S and the D are N-type.

Consequently, the MOSFETM1 and M3 to M6 are P-channel MOSFETs while the MOSFETM9 and the MB1 are N-channel MOSFETs. Also in this embodiment, the wells W are separated electrically from each other and connected to the sources S respectively in the MOSFETs. Consequently, no withstand voltage defect occurs in any of the MOSFETs even when all the gate oxide films are the same in thickness.

Figure 14:
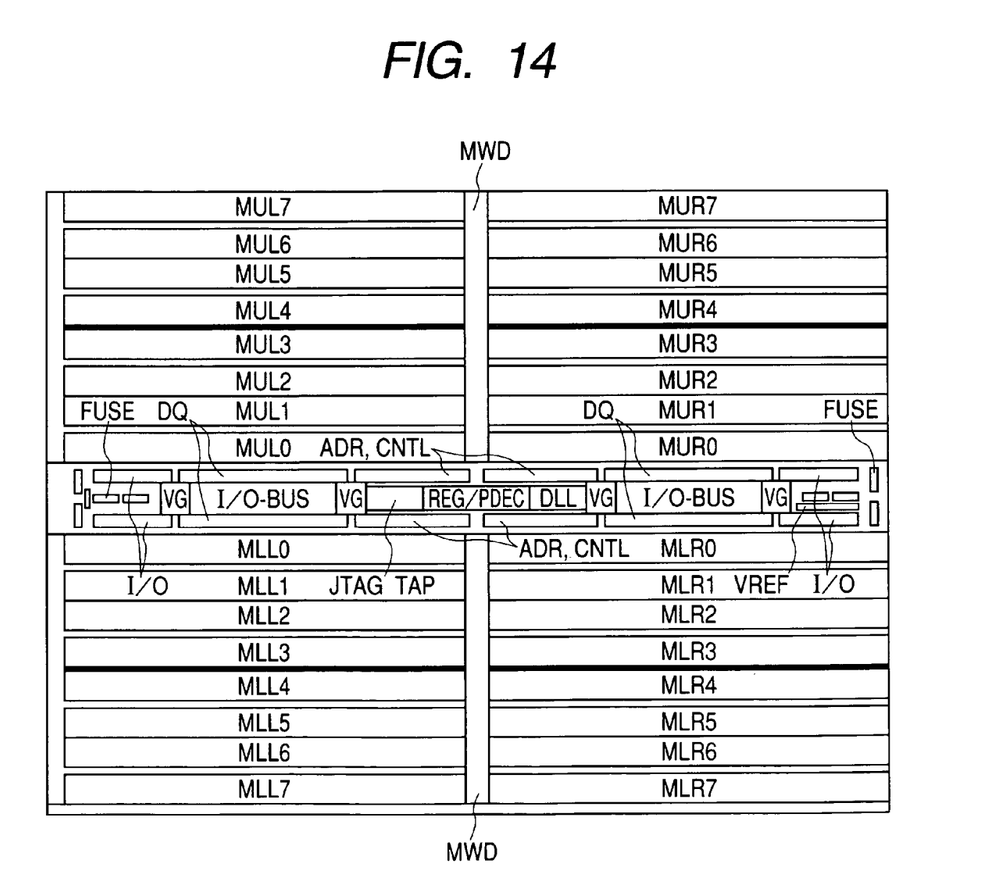
FIG. 14 is a block diagram of a static RAM in an embodiment of the present invention.

FIG. 14 shows a block diagram of a static RAM in an embodiment of the present invention. FIG. 14 shows an example of how each circuit block of the static RAM is disposed on a semiconductor substrate through the adjustment of geometrical layout of each circuit block. In FIG. 14, the reference symbols are defined as follows; MUL0 to MUL7, MUR0 to MUR7, MLL0 to MLL7, and MLR0 to MLR7 denote memory cell arrays laid out in arrays, MWD denotes a main word driver, I/O denotes an input/output circuit, ADR denotes an address buffer, CNTR denotes a control circuit, REG/PDEC denotes a pre-decoder or the like, and DQ denotes a data output circuit. In this embodiment, the center padding method is employed for the layout, so that the I/O circuit is also positioned in the center of the chip.

Other reference symbols in FIG. 14 are defined as follows; FUSE denotes a fuse circuit used to remedy memory array defects, etc., VREF denotes a reference voltage used to fetch input signals, VG denotes an internal voltage generation circuit, DLL denotes a clock synchronization circuit, and JTAG TAP denotes a test circuit. The input circuit of the present invention described above is disposed in the I/O circuit and used to fetch three input signals TCK, TMS, and TDI to be output to the test circuit JTAG TAP. The static RAM also includes an output circuit corresponding to an output signal TDO received from the test circuit JTAG TAP. Other circuits such as the input/output circuit I/O, the address buffer ADR, etc. can input small amplitude and fast data to be described later while the data output circuit DQ outputs small amplitude data corresponding to such the small amplitude and fast data. That is different from the input circuit described above.

Figure 15:
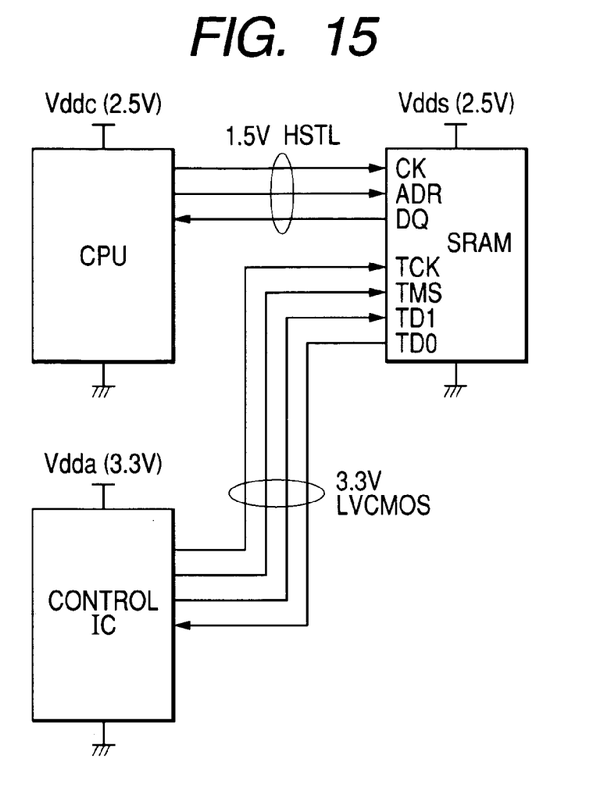
FIG. 15 is a block diagram of a system that uses semiconductor devices in an embodiment of the present invention.

FIG. 15 shows a block diagram of a system that uses the semiconductor device in an embodiment of the present invention. The system is constituted by a plurality of LSIs/ICs (CPU, control IC, and SRAM), each having an input/output interface with a voltage different from others. Each LSI/IC of the system has pins (CK, ADR, and DQ), each corresponding to a low voltage input interface and pins (TCK, TMS, TDI, and TDO), each corresponding to a high voltage input interface.

The latest process technique is employed for the core portion of each of the LSIs/ICs, which affects the performance of the system significantly used in this embodiment while the previous or older process technique is employed for the LSIs used in the test/evaluation control block that does not affect the system performance so much. In other words, the latest LSIs are used for both CPU and SRAM while the previous or older process technique is employed for manufacturing the control IC for testing. The SRAM is thus required to support the input/output interfaces related to the core blocks and the input/output interfaces related to the test/evaluation control blocks. Therefore, an HSTL having an amplitude of 5V is used as the input/output interface related to the core block while an LVCMOS having an amplitude of 3.3V is used as the input/output interface related to the test/evaluation control block.

The SRAM is constituted by thin gate insulator MOSFETs so as to correspond to the above-described 1.5V amplitude signals and enable reading/writing of fast signals related to the core block. In this embodiment, MOSFETs manufactured in the same process as that of the MOSFETs used for the core block are used to constitute the input circuit for the input/output interface related to the above test/evaluation control block as described in the above embodiment. Consequently, the SRAM is improved to prevent withstand voltage defects that might occur in MOSFETs.

The control IC related to the test/evaluation control block is formed with the process technique in the previous or older generation. Any existing control IC can thus be used for tests/evaluations if the test/evaluation contents are the same. This will make it easier to design and develop systems that can prevent withstand voltage defects that might occur in the semiconductor devices used in those systems.

As described above, according to the present invention, it is possible to prevent withstand voltage defects that might occur in MOSFETs for constituting the above input circuit even when a high voltage is inputted to the input circuit. In addition, if a resistor used in the above input circuit is constituted by a MOSFET, it is possible to prevent withstand voltage defects that might occur in the MOSFET, as well as to prevent the sequential biasing that might occur at each PN junction formed by a well and a substrate or deep well.

If the resistor used in the input circuit of the present invention is constituted of a MOSFET, the following effect is obtained; the layout area of the input circuit does not increase even when a large resistance value is set to reduce the input current of the input circuit. If a MOSFET constitutes the capacitor used in the input circuit of the present invention, this MOSFET is prevented from withstand voltage defects and each PN junction formed by a well and the substrate or deep well is prevented from sequential biasing.

If a MOSFET constitutes the capacitor used in the input circuit of the present invention, this MOSFET can be shared by a low-pass capacitance that prevents the high frequency component of the surge voltage from invasion into the LSIs. The chip size can thus be reduced due to the omission realized by such the sharing. And, if a voltage dividing circuit constituted by a resistor or MOSFET of the present invention is used, any logical threshold value can be set for the input buffer.

While the present invention objects achieved by the present inventor have been described with reference to the embodiments, the present invention is not limited only to those embodiments; they may be varied freely without departing from the spirit of the invention, of course. For example, the buffers BUF1 and BUF2 may be replaced with any devices if the devices can amplify small amplitude signals to form output signals in accordance with the signal amplitude corresponding to the internal supply voltage. In the system shown in FIG. 15, each of the CPU and the SRAM may be replaced with an LSI or IC that can process digital signals. The present invention can therefore apply widely to semiconductor devices that receive signals with larger signal amplitude than the signal amplitude of the internal circuit, as well as systems that use those semiconductor devices.

The effects to be obtained by typical one of the present invention objects disclosed in this specification will be as follows. The input circuit receives a voltage of an input signal inputted from an external terminal, which is divided by first and second resistor means and the AC component of the input signal through a capacitor disposed in parallel to the first resistor means. The input circuit then transmits an internal signal formed and reduced in signal amplitude therein to the internal circuit. Both of an input circuit and an internal circuit are constituted by MOSFETs formed in the same manufacturing process, thereby MOSFETs are prevented more effectively from occurrence of withstand voltage defect without making the process complicated.

Furthermore, the system of the present invention comprises a first semiconductor device, a second semiconductor device, and a third semiconductor device. The first semiconductor device includes first and second resistance means used to divide the voltage of a first signal inputted from a first external terminal and transmit the divided voltage to an input circuit and the AC component of the input signal to the input circuit through a capacitor disposed in parallel to the first resistance means. The first semiconductor device also includes a first input circuit that receives the divided voltage and a second input circuit that receives a second input signal from a second external terminal. The second input signal has a smaller amplitude than that of the first input signal. Each of the first and second input circuits is constituted by MOSFETs manufactured in the same process. The second semiconductor device forms an input signal corresponding to the first input circuit, then it is connected to the first semiconductor device. The third semiconductor device forms an input signal corresponding to the second input circuit, then it is connected to the first semiconductor device. Thus, the system of the present invention can be constituted so as to be developed and designed easily and prevented from withstand voltage defects that might occur in the semiconductor devices effectively.

What is claimed is:

1. A semiconductor device, comprising:
   first and second resistance elements for dividing a voltage of a first input signal inputted from an external terminal into a voltage-divided first input signal;
   first and second capacitors disposed in parallel to said first resistance element;
   an input circuit for receiving said voltage-divided first input signal thereby forming an output signal having a smaller amplitude than that of said input signal;
   an internal circuit for receiving said output signal from said input circuit; and
   an ESD circuit for preventing electrostatic destruction, said ESD circuit being coupled in series at one end to the external terminal, and at the other end to the first resistance element and the first and the second capacitors which are disposed in parallel,
   wherein the first input signal has an AC component which is transmitted to the input circuit via the first and second capacitors, and
   each of said input circuit and said internal circuit comprises MOSFETs.

2. The semiconductor device according to claim 1, wherein said voltage divided first input signal is transmitted to said input circuit through a source-drain path of a MOSFET having a gate to which a predetermined voltage is applied.

3. The semiconductor device according to claim 2, wherein each of said first and second resistance elements is constituted by MOSFETs, and
   wherein well portions under gates, sources and drains of the MOSFETs are separated electrically from each other and connected to the sources of the MOSFETs.

4. The semiconductor device according to claim 3, wherein the first and the second capacitors are constituted by MOSFETs.

5. The semiconductor device according to claim 4,
   wherein the first capacitor is constituted by a MOSFET whose gate terminal is coupled to an external terminal and whose source terminal and drain terminal are coupled to receive said voltage-divided first input signal, and
   wherein the second capacitor is constituted by a MOSFET whose gate terminal is coupled to receive said voltage-divided first input signal and whose source terminal and drain terminal are coupled to the external terminal.

6. The semiconductor device according to claim 5, wherein the semiconductor device is used as SRAM.

7. The semiconductor device according to claim 5,
   wherein the semiconductor device is used in a system constituted of a plurality of LSI/ICs each having an input/output interface corresponding to a different input signal voltage from others.

* * * * *